United States Patent
Horibe et al.

(10) Patent No.: US 12,519,061 B2
(45) Date of Patent: Jan. 6, 2026

(54) MULTICHIP INTERCONNECT PACKAGE FINE JET UNDERFILL

(71) Applicant: International Business Machines Corporation, Armonk, NY (US)

(72) Inventors: Akihiro Horibe, Yokohama (JP); Chinami Marushima, Urayasu (JP); Takahito Watanabe, Yokohama (JP); Takashi Hisada, Hachiouji (JP)

(73) Assignee: International Business Machines Corporation, Armonk, NY (US)

( * ) Notice: Subject to any disclaimer, the term of this patent is extended or adjusted under 35 U.S.C. 154(b) by 774 days.

(21) Appl. No.: 17/704,061

(22) Filed: Mar. 25, 2022

(65) Prior Publication Data

US 2023/0307372 A1    Sep. 28, 2023

(51) Int. Cl.
  *H01L 23/538*    (2006.01)
  *H01L 21/56*    (2006.01)
  (Continued)

(52) U.S. Cl.
  CPC ........ *H01L 23/5381* (2013.01); *H01L 21/563* (2013.01); *H01L 24/16* (2013.01); *H01L 24/32* (2013.01); *H01L 24/73* (2013.01); *H01L 24/92* (2013.01); *H01L 25/0655* (2013.01); *H01L 25/50* (2013.01); *H01L 2224/16227* (2013.01);
  (Continued)

(58) Field of Classification Search
  CPC .... H01L 23/5381; H01L 21/563; H01L 24/16
  See application file for complete search history.

(56) References Cited

U.S. PATENT DOCUMENTS

| | | | |
|---|---|---|---|
| 5,780,924 | A | 7/1998 | Mccormick |
| 9,653,428 | B1 | 5/2017 | Hiner et al. |
| 10,833,051 | B2 | 11/2020 | Arvin et al. |
| 11,404,379 | B2 | 8/2022 | Farooq et al. |
| 11,973,058 | B2 | 4/2024 | Sakuma et al. |
| 2009/0079060 | A1 | 3/2009 | Bartley |

(Continued)

OTHER PUBLICATIONS

Adamson, Steven J., "Jet Dispensing Underfills for Stacked Die Applications", Published in Amtest, Proc. Assembly Technology Expo, 2004, 5 pages, http://amtest-group.hu/uploads/Jet%20Dispensing%20Underfills%20for%20Stacked%20Die%20Applications.pdf.

(Continued)

*Primary Examiner* — Errol V Fernandes
(74) *Attorney, Agent, or Firm* — Seed Intellectual Property Law Group LLP (57) ABSTRACT

An interconnected semicondcutor subassembly structure and formation thereof. The interconnected semicondcutor subassembly structure includes an interconnect structure, and first and second semicondcutor dies bonded to respective portions of a top surface of the interconnect structure. The interconnected semicondcutor subassembly structure further includes an underfill layer formed within a first gap located between a bottom surface of the first semiconductor die and the first portion the top surface of the interconnect structure, formed within a second gap located between the bottom surface of the second semiconductor die and the second portion of the top surface of the interconnect structure, and formed within a first portion of a third gap located between the first semicondcutor die and the second semicondcutor die. A top surface of the underfill layer formed within the first portion of the third gap located between the first and second semicondcutor dies has a concave meniscus shape.

20 Claims, 8 Drawing Sheets

(51) Int. Cl.
*H01L 23/00* (2006.01)
*H01L 25/00* (2006.01)
*H01L 25/065* (2023.01)

(52) U.S. Cl.
CPC .............. *H01L 2224/32225* (2013.01); *H01L 2224/73204* (2013.01); *H01L 2224/92125* (2013.01)

(56) References Cited

U.S. PATENT DOCUMENTS

| | | |
|---|---|---|
| 2009/0189279 A1 | 7/2009 | How |
| 2013/0062760 A1 | 3/2013 | Hung et al. |
| 2019/0088607 A1 | 3/2019 | Wang |
| 2019/0096851 A1 | 3/2019 | Liao |
| 2021/0020531 A1* | 1/2021 | Cetegen .............. H01L 24/32 |
| 2021/0183773 A1 | 6/2021 | Rubin |
| 2022/0310501 A1 | 9/2022 | Wang et al. |
| 2023/0060756 A1 | 3/2023 | Lai et al. |
| 2023/0307307 A1 | 9/2023 | Horibe et al. |

OTHER PUBLICATIONS

Horibe et al., "Super Fine Jet Underfill Dispense Technique for Robust Micro Joint in Direct Bonded Heterogeneous Integration (DBHi) Silicon Bridge Packages", 5 pages, provided by Inventor Feb. 2022, Grace Period Disclosure document.

Horibe et al., "Super Fine Jet Underfill Dispense Technique for Robust Micro Joint in Direct Bonded Heterogeneous Integration (DBHi) Silicon Bridge Packages", Oct. 2021, 1 page, Abstract Only, Grace Period Disclosure document.

Miyazawa et al., "CFD Simulation Analysis and Experimental Study of Capillary Underfill Flow in Heterogeneous Integration", 2021 IEEE 71st Electronic Components and Technology Conference (ECTC), Jun. 1-Jul. 4, 2021, DOI: 10.1109/ECTC32696.2021. 00172, pp. 1050-1056.

Sikka et al., "Direct Bonded Heterogeneous Integration (DBHi) Si Bridge," 2021 IEEE 71st Electronic Components and Technology Conference (ECTC), 2021, pp. 136-147, doi: 10.1109/ECTC32696. 2021.00034, Abstract Only, 1 page.

Koifman et al., Hybrid Bonding Review, Image Sensors World, http://image-sensors-world.blogspot.com/2020/10/hybrid-bonding-review.html, Oct. 1, 2020, 8 pages.

Namics Corporation, Flip Chip Underfills (Encapsulants), Retrieved from: https://www.namics.co.jp/en/products/underfill-flipchip/ , Sep. 4, 2022, 4 pages.

Yess, K., Solving Fan-Out Wafer-Level Warpage Challenges Using Material Science, Semiconductor Engineering, , Sep. 10, 2018, 7 pages.

* cited by examiner

MULTICHIP INTERCONNECT PACKAGE FINE JET UNDERFILL

The following disclosures are submitted under 35 U.S.C. 102(b)(1)(A):

Super Fine Jet Underfill Dispense Technique for Robust Micro Joint in Direct Bonded Heterogenous Integration (DBHi) Silicon Bridge Packages, Akihiro Horibe, Chinami Marushima, Takahito Watanabe, Aakrati Jain, Eric Turcotte, Isabel de Sousa, Takashi Hisada, Kamal Sikka, October 2021, ABSTRACT only.

Super Fine Jet Underfill Technique for Robust Micro Joint in Direct Bonded Heterogenous Integration (DBHi) Silicon Bridge Packages, Akihiro Horibe, Chinami Marushima, Takahito Watanabe, Aakrati Jain, Eric Turcotte, Isabel de Sousa, Takashi Hisada, Kamal Sikka, February 2022, pages 1-5.

BACKGROUND OF THE INVENTION

The present invention relates generally to the field of integrated circuit packaging, and more particularly to improving the structural integrity and reliability of multi-chip packages.

In electronics, a three-dimensional (3D) integrated circuit (IC) is a chip or combination of chips in which two or more layers of active electronic components are integrated both vertically and horizontally into a single circuit. 3D packaging saves space by stacking separate chips in a single package. A multi-chip module (MCM) is a specialized electronic package where multiple integrated circuits (ICs), semiconductor dies or other discrete components are packaged onto a unifying substrate, facilitating their use as a single component. The MCM itself will often be referred to as a "chip" in designs, thus illustrating its integrated nature. This packaging, known as System in Package (SiP) or Chip Stack MCM, does not integrate the chips into a single circuit. Instead, the chips in the package communicate using off-chip signaling, much as if they were mounted in separate packages on a normal circuit board.

A SiP is a number of integrated circuits enclosed in a single module (i.e., package). The SiP performs all or most of the functions of an electronic system, and is typically used, for example, inside mobile phones, digital music players, etc. Dies containing integrated circuits may be stacked vertically on a substrate. In some cases, they are internally connected by fine wires that are bonded to the package. Alternatively, with flip chip technology, solder bumps are used to join stacked chips together. SiP dies can be stacked vertically or tiled horizontally, unlike slightly less dense multi-chip modules, which place dies horizontally on a carrier. SiP connects the dies with standard off-chip wire bonds or solder bumps, unlike slightly denser three-dimensional integrated circuits which connect stacked silicon dies with conductors running through the die. Many different 3-D packaging techniques have been developed for stacking many more-or-less standard chip dies into a compact area.

An example SiP can contain several chips (such as a specialized processor, DRAM, flash memory) combined with passive components, for example resistors and capacitors, which are mounted on the same substrate. This means that a complete functional unit can be built in a multi-chip package, so that few external components need to be added to make it work. This is particularly valuable in space constrained environments as it reduces the complexity of the package substrate and overall design.

SUMMARY

According to one embodiment of the present invention, an interconnected semicondcutor subassembly structure is provided. The interconnected semicondcutor subassembly structure includes an interconnect structure, a first semicondcutor die bonded to a first potion of a top surface of the interconnect structure, and a second semicondcutor die bonded to a second portion of the top surface of the interconnect structure. The interconnected semicondcutor subassembly structure further includes an underfill layer formed within a first gap located between the bottom surface of the first semiconductor die and the first portion the top surface of the interconnect structure, formed within a second gap located between the bottom surface of the second semiconductor die and the second portion of the top surface of the interconnect structure, and formed within a first portion of a third gap located between the first semicondcutor die and the second semicondcutor die. A top surface of the underfill layer formed within the first portion of the third gap located between the first semicondcutor die and the second semicondcutor die has a concave meniscus shape.

According to another embodiment of the present invention, a method of forming an interconnected semicondcutor subassembly structure is disclosed. The method includes bonding a first semicondcutor die to a first portion of a top surface of an interconnect structure. The method further includes bonding a second semicondcutor die to a second portion of the top surface of the interconnect structure. The method further includes forming an underfill layer within a first gap located between a bottom surface of the first semiconductor die and the first portion of the top surface of the interconnect structure, within a second gap located between a top surface of the second semiconductor die and a second portion of the bottom surface of the interconnect structure, and within a first portion of a third gap located between the first semicondcutor die and the second semicondcutor die. A top surface of the underfill layer formed within the first portion of the third gap located between the first semicondcutor die and the second semicondcutor die has a concave meniscus shape.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which:

When viewed as ordered combinations, FIGS. 1-8 illustrate both (i) semiconductor devices and (ii) the methods for forming such semiconductor devices, in accordance with illustrative embodiments.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The present invention relates generally to the field of integrated circuit packaging, and more particularly to improving the structural integrity and reliability of multi-chip packages.

Chip-package interaction (CPI) has become a critical reliability issue for copper (Cu)/low-k chips interconnected by a bridge structure. Reflow soldering is the most widely used method of attaching surface mount components, such as bridged semiconductor dies to a package substrate, such as a laminate and a printed circuit board (PCB). The aim of the solder reflow process is to form acceptable solder joints by heating and subsequently cooling the surface mount component, PCB and solder.

However, embodiments of the present invention recognize that during this solder reflow process, thermo-mechanical deformations, and thereby thermal stress, can occur at the solder joints between the chip and interconnect structure (e.g., interposer or bridge) due to differences in the coefficients of thermal expansion (CTEs) between the chip and organic substrate. In order to "soften" the CTE mismatch between a chip package having multiple chips interconnected by an interconnect structure, embodiments of the present invention provide for an underfill formed between the chip and interconnect structure. The underfill provides an additional mechanical bond between the chip and interconnect structure, which helps to protect the solder microbump joints formed between the chip and interconnect structure from mechanical stress.

One type of underfill process that can be used for bonding a chip to interconnect structure is non-conductive paste (NCP) bonding. However, NCP material(s) have a relatively low fracture toughness and adhesion strength, and the bonding process using NCP material(s) can result in filler entrapment issues that further degrade the mechanical strength of the solder joints. Another type of underfill process for bonding a chip to an interconnect structure, such as a bridge, is dispensing an underfill material from the edge of the chip/bridge subassembly using a jet dispenser. However, dispensing the underfill material from the edge of the chip/bridge subassembly can result in contamination of the standard C4 solder bumps joining the chip to the package substrate, as well as the backside of the chip and bridge structure itself.

Embodiments of the present invention improve upon the foregoing deficiencies of current underfill and soldering processes of multi-chip interconnected structures, and the resulting structures thereof, by forming an underfill layer located not only between the chips and the interconnect structure, but also between the chips themselves. According to an embodiment of the present invention, an interconnect subassembly (chip-interconnect-chip) structure is formed having two chips attached to respective portions of the top of an interconnect structure, in which the gaps between each respective chip and the interconnect structure, as well at least a portion of the gap between the two chips are filled with an underfill material prior to mounting the interconnect subassembly structure to an organic substrate. In this embodiment, underfill material is initially deposited within the gap between the two chips, and subsequently flows within the gaps between the chips and the interconnect structure via capillary action. The deposition of the underfill within the gap ultimately allows for an underfill layer to be formed between the chips of the chip-interconnect structure.

By forming an underfill layer in the gap between the chips in addition to the gaps between the chips and the interconnect structure, the amount of chip movement endured during the cooling phase after soldering the chip-interconnect-chip structure to an organic substrate is greatly reduced. This ultimately results in a reduction and/or elimination of any micro-joint fractures of the solder microbump joints between the chips and the interconnect structure during the cooling phase. Furthermore, by forming an underfill layer in the gap between the chips in addition to the gaps between the chips and the interconnect structure, the chip-interconnect-chip structure can be attached to an organic substrate, such as a package substrate, through a standard reflow processes, but without the need for pre-cooling after mounting and reflow of the solder bumps joining the chip-interconnect-chip structure to the organic substrate. Accordingly, the chip-interconnect-chip structures of the present invention can be attached to an organic substrate in a shorter amount of time than current practices.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

As used herein, terms such as "depositing," "forming," and the like may refer to the disposition of layers, or portions of materials, in accordance with a given embodiment. Such processes may or may not be different than those used in the standard practice of the art of microcooler device fabrication. Such processes include, but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, electroplating, evaporation, ion beam deposition, electron beam deposition, laser assisted deposition, chemical solution deposition, or any combination of those methods.

As used herein, terms, such as "forming," and the like, may refer to processes that alter the structure and/or composition of one or more layers of material or portions of materials in accordance with a given embodiment. For example, such formation processes may include, but are not limited to, exposure to a specific frequency or range of frequencies of electromagnetic radiation, ion implantation techniques, and/or chemical/mechanical polishing (CMP). As used herein, terms, such as "forming," and the like, may refer to processes that alter the structure of one or more layers of material, or portions of material(s), by removal of a quantity of material, in accordance with a given embodiment. For example, such formation processes may include, but are not limited to, micromachining, microetching, wet and/or dry etching processes, plasma etching processes, or any of the known etching processes in which material is removed.

Those skilled in the art understand that many different techniques may be used to add, remove, and/or alter various materials, and portions thereof, and that embodiments of the present invention may leverage combinations of such processes to produce the structures disclosed herein without deviating from the scope of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The Figures represent cross-section portions of various semiconductor structures and sub-assembly structures, and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

The present invention will now be described in detail with reference to the Figures, wherein like reference numerals refer to like elements throughout. FIGS. 1-8 include various cross-sectional views depicting illustrative steps of a method, and the resulting structures thereof, for manufacturing semiconductor devices, and in particular, a chip-interconnect-chip structure having underfill formed between the chips and interconnect, as well as between the chips themselves, according to select embodiments of the present invention. One having ordinary skill in the art will appreciate that there are many options available for the formation of the structures described herein and that the following discussion does not limit embodiments to only the techniques described herein.

Figure 1:
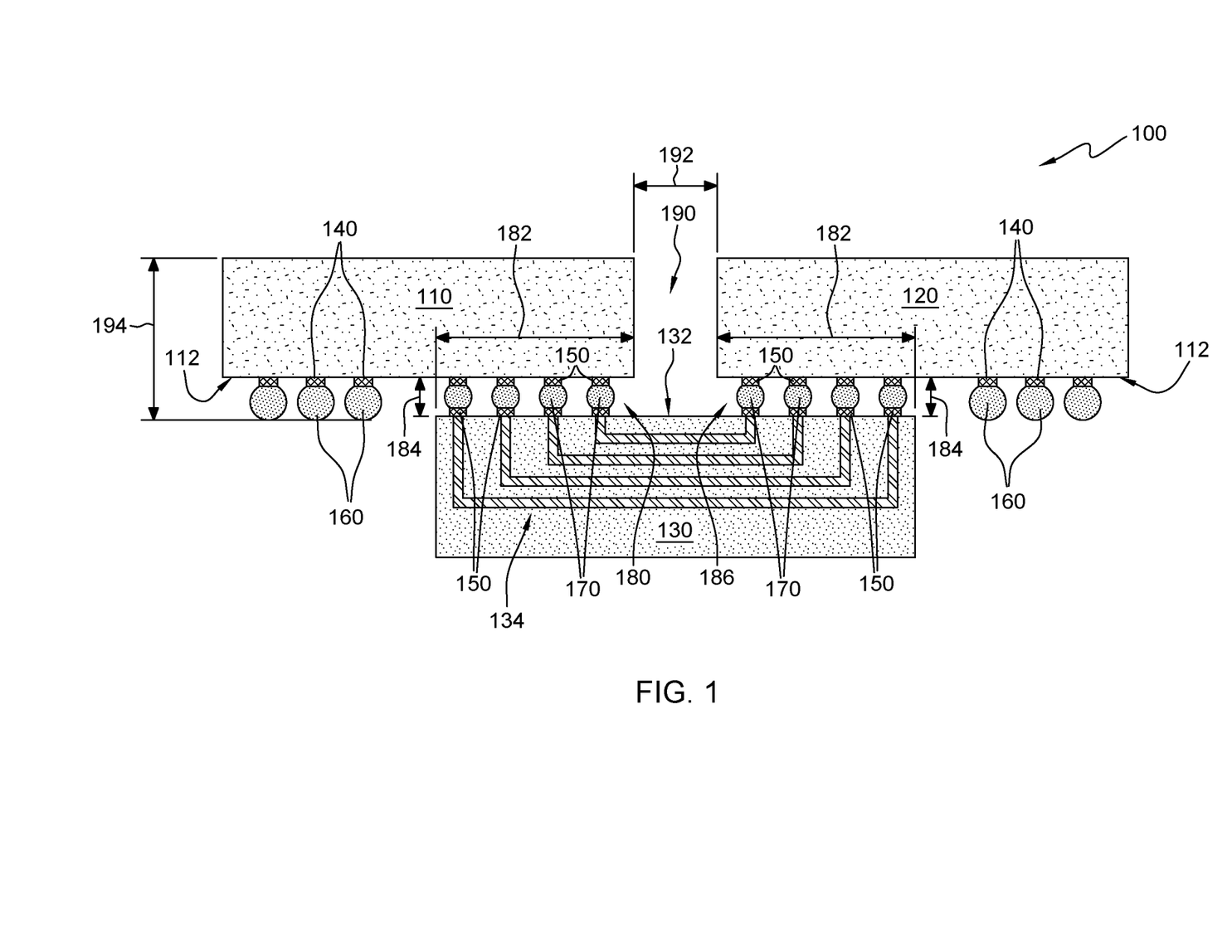
FIG. 1 illustrates a cross-sectional view of an interconnected semiconductor subassembly structure, generally designated 100, in accordance with at least one embodiment of the present invention.

Referring now to FIG. 1, FIG. 1 illustrates a cross-sectional view of an interconnected semiconductor subassembly structure, generally designated 100, in accordance with at least one embodiment of the present invention. Interconnected semiconductor subassembly structure 100 includes semiconductor die 110 and semiconductor die 120 electrically interconnected with one another by interconnect structure 130.

Prior to forming interconnected semiconductor subassembly structure 100 as depicted in FIG. 1, bonding pads 140 and bonding pads 150 were initially formed on portions of what is now depicted as bottom side 112 of semiconductor dies 110 and 120, and bonding pads 150 were initially formed on top side 132 of interconnect structure 130. Solder bumps 160 were thereafter formed on top of bonding pads 140 of semiconductor dies 110 and 120. In an embodiment, and as depicted in FIG. 1, solder bumps 160 are C4s (controlled collapse chip connections). Similarly, microbumps 170 were thereafter formed on top of bonding pads 150. In an embodiment, and as depicted in FIG. 1, microbumps 170 are micro C4s that have a smaller diameter and finer pitch as compared to solder bumps 160. In another embodiment, microbumps 170 are micro metal joints that are formed at least partially from a solder or solder alloy. In yet another embodiment, microbumps 170 are micro metal joints that are formed without any solder or solder alloy.

After solder bumps 160 and microbumps 170 were formed on top of bonding pads 140 and 150 located on semiconductor dies 110 and 120, respectively, semiconductor dies 110 and 120 were flipped over or turned upside down, and microbumps 170 were lined up with and attached to corresponding bonding pads 150 located on top side 132 of interconnect structure 130 as depicted in FIG. 1. The attachment of semiconductor dies 110 and 120 to interconnect structure 130 can be completed by heating semiconductor subassembly structure 100, which results in the reflow of microbumps 170, followed by a subsequent cooling period. In an embodiment, formic acid reflow of microbumps 170 can be performed if flux is not used in the soldering process.

After the cooling of semiconductor subassembly structure 100, a solder bond or solder joint is formed between microbumps 170 and bonding pads 150. In embodiments in which solder bumps 160 are attached to bonding pads 140 prior to heating semiconductor subassembly structure 100, solder bumps 160 should be formed from solder that has a higher melting point than microbumps 170 to ensure that the reflow of solder bumps 160 does not occur at this point. However, in embodiments in which solder bumps 160 are attached to bonding pads 140 after heating semiconductor subassembly structure 100, solder bumps may be formed from solder that has the same or similar melting point as microbumps 170.

Semiconductor dies 110 and 120 can be made from any generally known semiconductor materials (e.g., silicon, gallium arsenide, or germanium) and includes an integrated circuit formed thereon. As depicted in FIG. 1, semiconductor dies 110 and 120 are flip chips.

Interconnect structure 130 is a bridge that is configured to route electrical signals between semiconductor dies 110 and 120. Interconnect structure 130 can be made from any generally known bridge materials (e.g., glass, organic, or silicon based materials). In an embodiment, interconnect structure 130 can be made from a semiconductor material, such as, but not limited to, silicon (Si), germanium (Ge), a silicon germanium (SiGe) alloy, a silicon carbide (SiC) alloy, a silicon germanium carbide (SiGeC) alloy, or a III/V compound semiconductor (e.g., InAs, GaAs or InP). In another embodiment, interconnect structure 130 can be made from a dielectric material such as, for example, undoped glass or doped glass. In another embodiment, interconnect structure 130 can be made from a metal such as, for example, titanium (Ti), vanadium (V), chromium (Cr), manganese (Mn), iron (Fe), cobalt (Co), nickel (Ni), copper (Cu), molybdenum (Mo) and alloys, oxides and nitrides thereof.

Interconnect wires 134 are routed through various layers of interconnect structure 130 and connected to corresponding microbumps 170 of semiconductor dies 110 and 120, respectively. Interconnect wires 134 provide an electrical interface for communicating or otherwise transferring data between semiconductor dies 110 and 120. Interconnect wires 134 can be formed from any generally known materials for transmitting signal data, including, but not limited to, copper or tungsten wire.

As further depicted in FIG. 1, a gap 180 having a gap length 182 and a gap height 184 exists between bottom side 112 of semiconductor die 110 and top side 132 of interconnect structure 130. Similarly, a gap 186 having a gap length 182 and a gap height 184 exists between bottom side 112 of semiconductor die 120 and top side 132 of interconnect structure 130. Furthermore, a gap 190 having a gap length 192 and a gap height 194 exists between semiconductor dies 110 and 120. Although gaps 180 and 186 are depicted in FIG. 1 as having the same gap length 182, embodiments of the present invention are not necessarily limited to these particular lengths. For example, depending on length of a semiconductor die that is attached to interconnect structure 130, the length of the gap between the portion of the semiconductor die attached to interconnect structure 130 may increase or decrease.

In an embodiment, and as depicted in FIG. 1, gap length 192 of gap 190 is greater than gap height 184 of gaps 180 and 186, respectively. This stems from the fact that in accordance with embodiments of the present invention, an underfill material 310 (depicted in FIG. 3) is initially dispensed within gap 190, and subsequently flows between gaps 180 and 186 via capillary action to form underfill layer 320 (depicted in FIG. 3). In an embodiment, gap length 182 of gaps 180 and 186 is greater than or equal to 50 um and less than or equal to 500 um. In an embodiment, gap height 184 of gaps 180 and 186 is greater than or equal to 5 um and less than or equal to 100 um.

Figure 2:
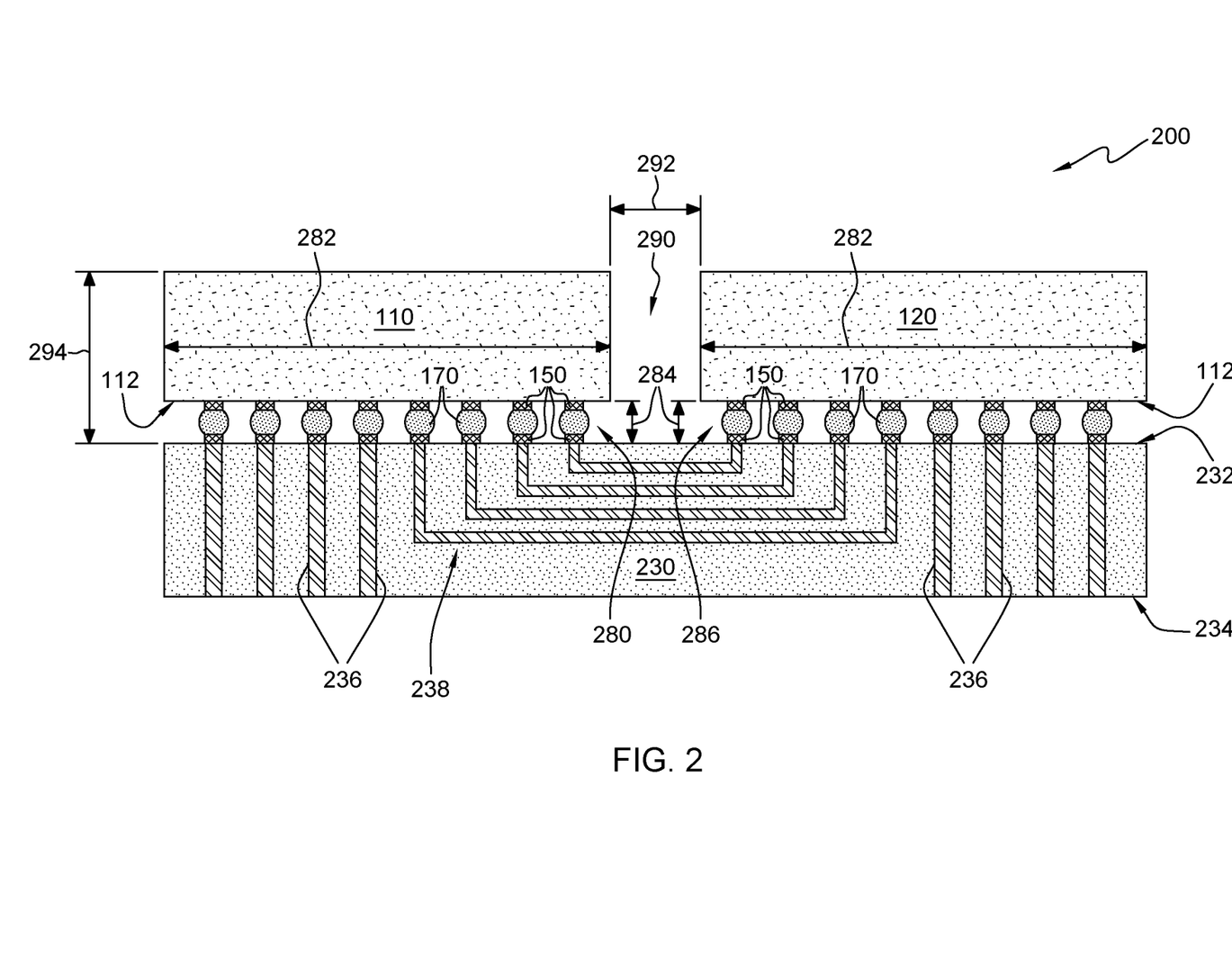
FIG. 2 illustrates a cross-sectional view of an interconnected semiconductor subassembly structure, generally designated 200, in accordance with at least one embodiment of the present invention.

Referring now to FIG. 2, FIG. 2 illustrates a cross-sectional view of an interconnected semiconductor subassembly structure, generally designated 200, in accordance with at least one embodiment of the present invention. Interconnected semiconductor subassembly structure 200 includes semiconductor die 110 and semiconductor die 120 electrically interconnected with one another by an interconnect structure 230.

Prior to forming interconnected semiconductor subassembly structure 200 as depicted in FIG. 2, bonding pads 150 were initially formed on portions of what is now depicted as bottom side 112 of semiconductor dies 110 and 120, and bonding pads 150 were also initially formed on top side 232 of interconnect structure 230. Microbumps 170 were thereafter formed on top of bonding pads 150 located on semiconductor dies 110 and 120. In an embodiment, and as depicted in FIG. 1, microbumps 170 are micro C4s that have a smaller diameter and finer pitch as compared to solder bumps 160. In another embodiment, microbumps 170 are micro metal joints that are formed at least partially from a solder or solder alloy. In yet another embodiment, microbumps 170 are micro metal joints that are formed without any solder or solder alloy.

After microbumps 170 are formed on top of bonding pads 150 located on semiconductor dies 110 and 120, respectively, semiconductor dies 110 and 120 were flipped over or turned upside down, and microbumps 170 were lined up with and attached to corresponding bonding pads 150 located on top side 232 of interconnect structure 230. The attachment of semiconductor dies 110 and 120 to interconnect structure 230 can be completed by heating semiconductor subassembly structure 200, which results in the reflow of microbumps 170, followed by a subsequent cooling period. In an embodiment, formic acid reflow of microbumps 170 can be performed if flux is not used in the soldering process.

After the cooling of semiconductor subassembly structure 200, a solder bond or solder joint is formed between microbumps 170 and bonding pads 150. In embodiments in which solder bumps 160 (not depicted) are attached to bonding pads 140 (not depicted) on bottom side 234 of interconnect structure 230 prior to heating semiconductor subassembly structure 200, solder bumps 160 should be formed from solder that has a higher melting point than microbumps 170 to ensure that the reflow of solder bumps 160 does not occur at this point. However, in embodiments in which solder bumps 160 (not depicted) are attached to bonding pads 140 (not depicted) on bottom side 234 of interconnect structure 230 (not depicted in FIG. 2) after heating semiconductor subassembly structure 200, microbumps may be formed from solder that has the same or similar melting point as microbumps 170.

In an embodiment, and as depicted in FIG. 2, interconnect structure 230 is an interposer that is configured to route electrical signals between semiconductor dies 110 and 120. Interconnect structure 230 can made from any generally known interposer materials (e.g., glass, organic, or silicon based materials). In an embodiment, interconnect structure can be made from a semiconductor material, such as, but not limited to, silicon (Si), germanium (Ge), a silicon germanium (SiGe) alloy, a silicon carbide (SiC) alloy, a silicon germanium carbide (SiGeC) alloy, or a III/V compound semiconductor (e.g., InAs, GaAs or InP). In another embodiment, interconnect structure 230 can be made from a dielectric material such as, for example, undoped glass or doped glass. In another embodiment, interconnect structure 230 can be made from a metal such as, for example, titanium (Ti), vanadium (V), chromium (Cr), manganese (Mn), iron (Fe), cobalt (Co), nickel (Ni), copper (Cu), molybdenum (Mo) and alloys, oxides and nitrides thereof.

A plurality of through hole vias (THVs) 236 are formed through interconnect structure 230 that provide an electrical pathway between top side 232 and bottom side 234 of interconnect structure 230. In an embodiment where interconnect structure 230 is a silicon interposer, THVs 236 are through silicon vias (TSVs). In an embodiment where interconnect structure 230 is a glass interposer, THVs 236 are through glass vias (TGVs). In an embodiment where interconnect structure 230 is a ceramic interposer, THVs 236 are through ceramic vias (TCVs). A plurality of interconnect wires 238 are routed through various layers of interconnect structure 230 and connected to corresponding microbumps 170 of semiconductor dies 110 and 120, respectively. Interconnect wires 238 provide an electrical interface for communicating or otherwise transferring data between semiconductor dies 110 and 120. Interconnect wires 238 can be formed from any generally known materials for transmitting signal data, including, but not limited to, copper or tungsten wire.

As further depicted in FIG. 2, a gap 280 having a gap length 282 and a gap height 284 exists between bottom side 112 of semiconductor die 110 and top side 232 of interconnect structure 230. Similarly, a gap 286 having a gap length 282 and a gap height 284 exists between bottom side 112 of semiconductor die 120 and top side 232 of interconnect structure 230. A gap 290 having a gap length 292 and a gap height 294 also exists between semiconductor dies 110 and 120. Although gaps 180 and 186 are depicted in FIG. 2 as having the same gap length 282, embodiments of the present invention are not necessarily limited to these particular lengths. For example, depending on length of a semiconductor die that is attached to interconnect structure 230, the length of the gap between the portion of the semiconductor die attached to interconnect structure 230 may increase or decrease.

In an embodiment, and as depicted in FIG. 2, gap length 292 of gap 290 is greater than gap height 284 of gaps 280 and 286, respectively. This stems from the fact that in accordance with embodiments of the present invention, an underfill material 410 (depicted in FIG. 4) is initially dispensed between gap 290, and subsequently flows between gaps 280 and 286 via capillary action to form underfill layer 420 (depicted in FIG. 4) within gaps 280, 286, and 290. In an embodiment, gap length 282 of gaps 280 and 286 is greater than or equal to 50 um and less than or equal to 500 um. In an embodiment, gap height 284 of gaps 280 and 286 is greater than or equal to 5 um and less than or equal to 100 um.

Figure 3:
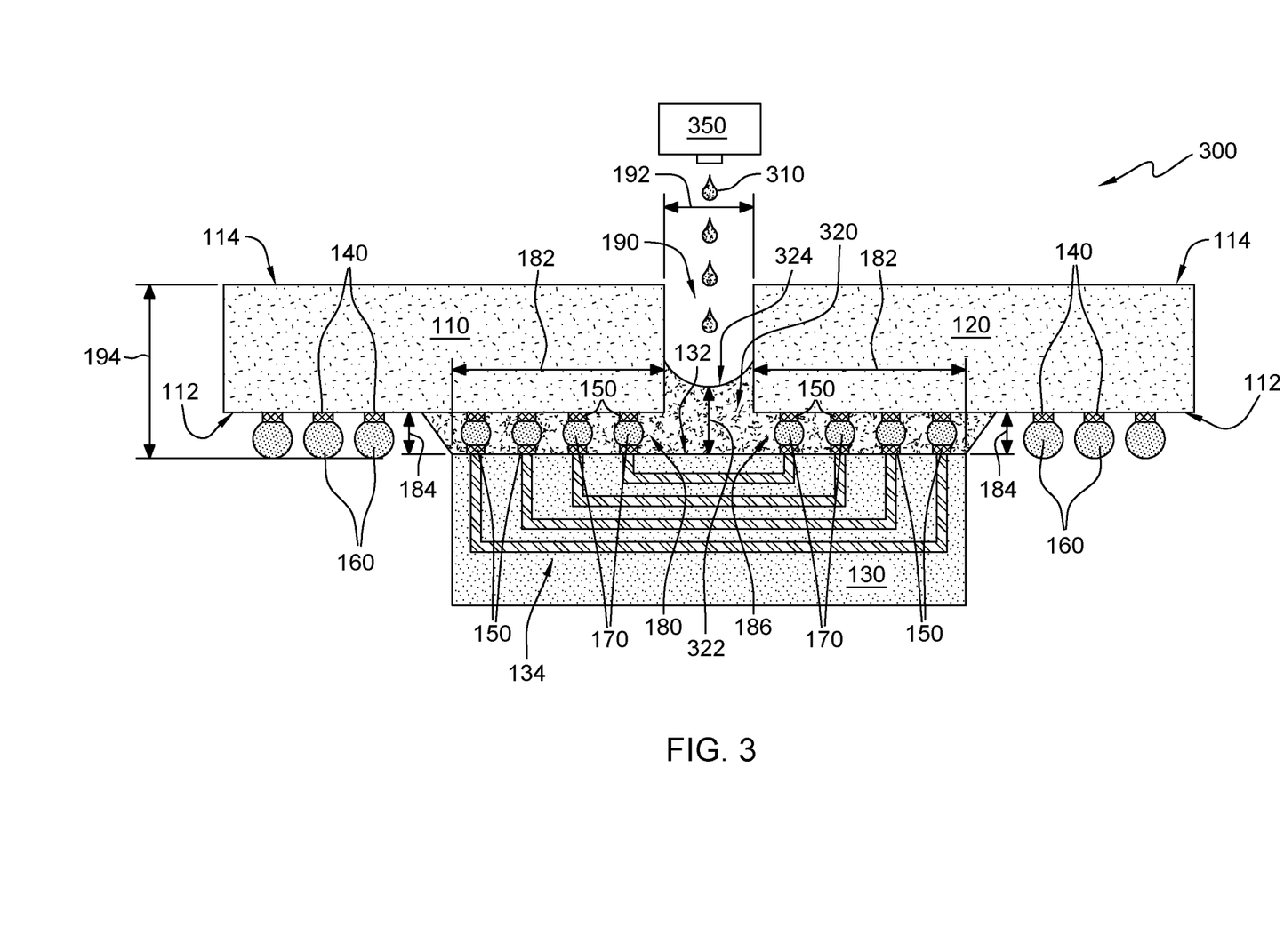
FIG. 3 is a cross-sectional view of interconnected semicondcutor subassembly structure 100 after formation of an underfill layer 320, generally depicted as subassembly structure 300, in accordance with at least one embodiment of the present invention.

Referring now to FIG. 3, FIG. 3 is a cross-sectional view of interconnected semicondcutor subassembly structure 100 after formation of an underfill layer 320, generally depicted as subassembly structure 300, in accordance with at least one embodiment of the present invention. As depicted in FIG. 3, underfill material 310 has been deposited and cured to form underfill layer 320. Specifically, underfill layer 320 is formed in and completely fills gap 180 between bottom side 112 of semiconductor die 110 and top side 132 of interconnect structure 130, is formed in and completely fills gap 186 between bottom side 112 of semiconductor die 120 and top side 132 of interconnect structure 130, and is formed in and partially fills gap 190 between semiconductor dies 110 and 120. In an embodiment, underfill material 310 deposited within gap 190 self-cures as additional underfill material 310 is deposited, thus reducing the number of processing steps. In another embodiment, underfill material 310 only partially cures during the deposition of underfill material 310 and an additional post-cure processing step is performed.

Underfill material 310 can be any underfill materials known in the art. For example, underfill material 310 may be a composite material made up of a resin, such as an epoxy polymer, and can include one or more additional elements, including, but not limited to, filler materials, flow agents, adhesion promoters, and dyes. In an embodiment in which one or more filler materials are used, the filler material is a relatively fine (e.g., less than or equal to an a maximum diameter or less than or equal to an average diameter). In an embodiment, the filler material of underfill material 310 has a maximum diameter less than or equal to 1.2 um and an average diameter less than or equal to 0.3 um. However, embodiments of the present invention are not necessarily limited to these particular dimensions. In an embodiment, underfill material 310 is a capillary underfill. In an embodiment, underfill material 310 has a CTE that is within a predetermined threshold of that of microbumps 170. In an embodiment, underfill material 310 has a relatively low viscosity (e.g., 35 pascal second (Pa-s)). However, embodiments of the present invention may be practiced using an underfill material that has a viscosity that is less than or greater than 35 Pa-s.

Underfill material 310 is deposited within gap 190 between semiconductor dies 110 and 120 via dispenser 350. Dispenser 350 may be representative of any underfill material or chip binding material dispensing techniques known in the art. In an embodiment, dispenser 350 is an auger or linear positive displacement pump with a needle. In another embodiment, dispenser 350 is a jet dispenser. In an embodiment where dispenser 350 is a jet dispenser, dispenser 350 may be a piezo jet dispenser, a pressure jet dispenser, a mechanical jet dispenser, a thermal jet dispenser, or a continuous jet dispenser. In an embodiment where dispenser 350 is a jet dispenser, the jet dispenser includes a fine dispensing nozzle or needle. For example, the nozzle or needle diameter of dispenser 350 may be 50 um. However, embodiments of the present invention may be practiced with a jet dispenser having a nozzle size that is less than or greater than 50 um depending on the gap dimensions of gaps 180, 186, and 190.

In an embodiment, dispenser 350 dispenses underfill material 310 between gap 190 from a fixed vertical position relative to a top surface 114 of semiconductor dies 110 and 120, and a fixed horizontal position relative to gap length 192 of gap 190. In another embodiment, dispenser 350 moves back and forth along an x-axis with respect to gap length 192 of gap 190 as dispenser 350 dispenses dots of underfill material 310 to form multiple lines of underfill material. This technique is commonly referred to as "jetting on the fly."

The amount of underfill material 310 that is required to be deposited between gap 190 of semiconductor dies 110 and 120 is based, at least in part, on the volume of gaps 180 and 186, minus the volume of microbumps 170 located within gaps 180 and 186, plus a particular volume of gap 190 to reach a predetermined height 322 of underfill layer 320 within gap 190 between semiconductor dies 110 and 120. In an embodiment, the amount of underfill material 310 dispensed can be controlled based on the dot size of underfill material 310 dispensed and the number of dots dispensed. It should be appreciated that by dispensing a controlled amount of underfill material between gap 190 located between semiconductor dies 110 and 120 prior to attaching semiconductor structure 300 to an organic substrate, such as package substrate 710 (depicted in FIG. 700), gaps 180 and 186 can be completely filled with underfill material 310 without any excess underfill material 310 contaminating any neighboring solder bumps 160 located on bottom surface of processor dies 110 and 120.

In an embodiment, and as depicted in FIG. 3, a top surface 324 of underfill layer 320 formed within gap 190 has a concave meniscus shape. This concave meniscus shape is formed due to the surface tension of underfill material 310 along the sides of semiconductor dies 110 and 120 that form gap 190. In an embodiment, and as depicted in FIG. 1, height 322 of underfill layer 320 within gap 190 is precalculated based on a maximum amount of underfill material 310 that can be dispensed within gap 190 without any excess underfill material 310 forming outside of gaps 180 and 186 in a lengthwise direction towards solder balls 160.

Figure 4:
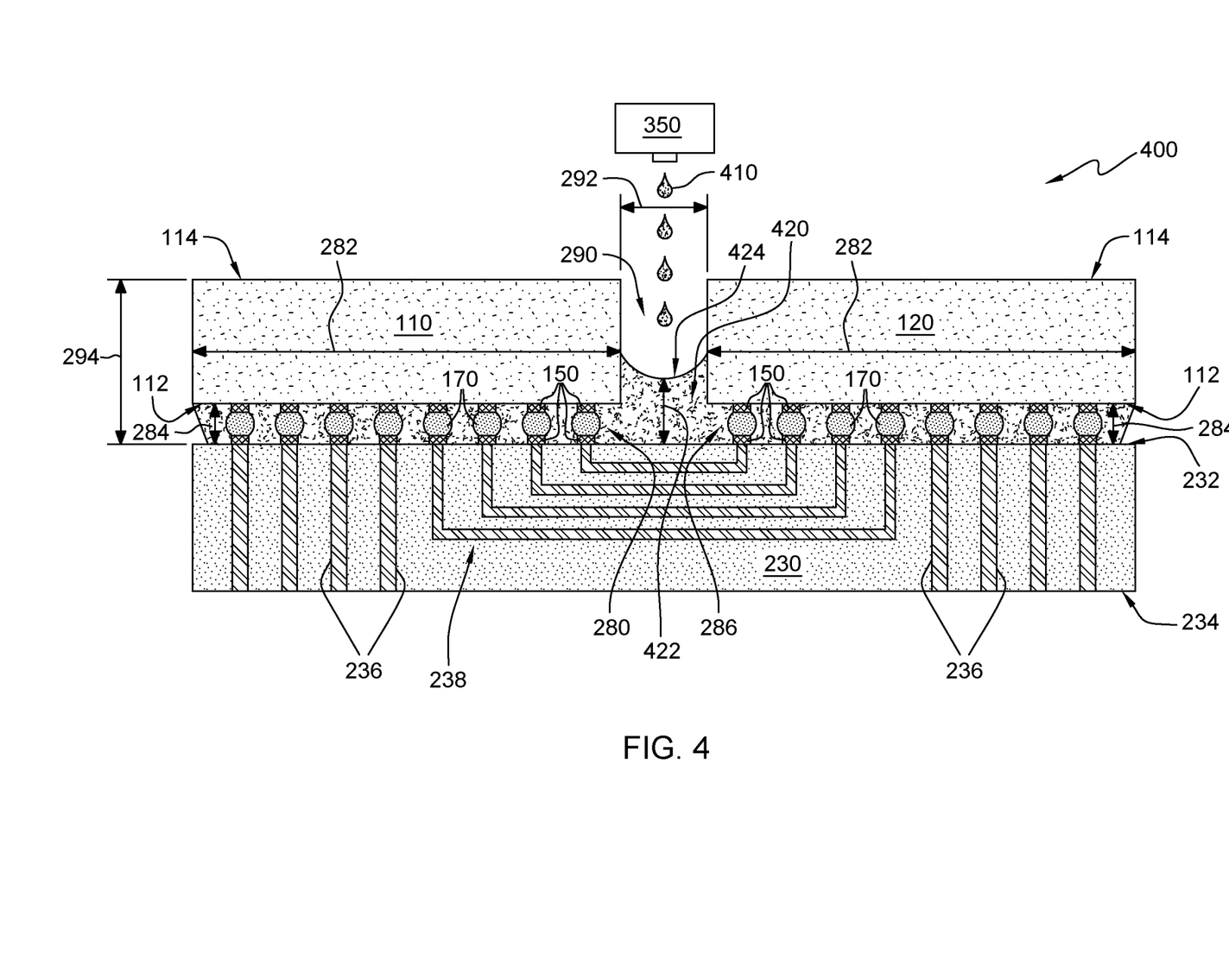
FIG. 4 is a cross-sectional view of interconnected semicondcutor subassembly structure 200 after formation of an underfill layer 420, generally depicted as interconnected semicondcutor subassembly structure 400, in accordance with at least one embodiment of the present invention.

Referring now to FIG. 4, FIG. 4 is a cross-sectional view of interconnected semicondcutor subassembly structure 200 after formation of an underfill layer 420, generally depicted as interconnected semicondcutor subassembly structure 400, in accordance with at least one embodiment of the present invention. As depicted in FIG. 4, underfill material 410 has been deposited and cured to form underfill layer 420. Specifically, underfill layer 420 is formed in and completely fills gap 280 between bottom side 112 of semiconductor die 110 and top side 232 of interconnect structure 230, is formed in and completely fills gap 286 between bottom side 112 of semiconductor die 120 and top side 232 of interconnect structure 230, and is formed in and partially fills gap 290 between semiconductor dies 110 and 120. In an embodiment, underfill material 410 deposited within gap 190 self-cures as additional underfill material 410 is deposited, thus reducing the number of processing steps. In another embodiment, underfill material 410 only partially cures during the deposition of underfill material 410 and an additional post-cure processing step is performed.

Underfill material 410 can be any underfill materials known in the art. For example, underfill material 410 may be a composite material made up of a resin, such as an epoxy polymer, and can include one or more additional elements, including, but not limited to, filler materials, flow agents, adhesion promoters, and dyes. In an embodiment in which one or more filler materials are used, the filler materials of underfill material 410 are relatively fine (e.g., less than or equal to an a maximum diameter or less than or equal to an average diameter). In an embodiment, the filler material of underfill material 410 has a maximum diameter less than or equal to 1.2 um and an average diameter less than or equal to 0.3 um. However, embodiments of the present invention are not necessarily limited to these particular dimensions. In an embodiment, underfill material 410 is a capillary underfill. In an embodiment, underfill material 410 has a CTE that is within a predetermined threshold of that of microbumps 170. In an embodiment, underfill material 410 has a relatively low viscosity (e.g., 35 pascal second (Pa-s)). However, embodiments of the present invention may be practiced using an underfill material that has a viscosity that is less than or greater than 35 Pa-s.

Underfill material 410 is deposited within gap 290 between semiconductor dies 110 and 120 via dispenser 350. Dispenser 350 may be representative of any underfill or chip binding material dispensing techniques known in the art. In an embodiment, dispenser 350 is an auger or linear positive displacement pump with a needle. In another embodiment, dispenser 350 is a jet dispenser. In an embodiment where dispenser 350 is a jet dispenser, dispenser 350 may be a piezo jet dispenser, a pressure jet dispenser, a mechanical jet dispenser, a thermal jet dispenser, or a continuous jet dispenser. In an embodiment where dispenser 350 is a jet dispenser, the jet dispenser includes a fine dispensing nozzle or needle. For example, the nozzle or needle diameter of dispenser 350 may be 50 um. However, embodiments of the present invention may be practiced with a jet dispenser having a nozzle size that is less than or greater than 50 um.

In an embodiment, dispenser 350 dispenses underfill material 410 between gap 290 from a fixed vertical position relative to a top surface 114 of semiconductor dies 110 and 120, and a fixed horizontal position relative to gap length 292 of gap 290. In another embodiment, dispenser 350 moves back and forth along an x-axis with respect to gap length 292 of gap 290 as dispenser 350 dispenses dots of underfill material 410 to form multiple lines of underfill material. This technique is commonly referred to as "jetting on the fly."

The amount of underfill material 410 that is required to be deposited between gap 290 of semiconductor dies 110 and 120 is based, at least in part, on the volume of gaps 280 and 286, minus the volume of microbumps 170 located within gaps 280 and 286, plus a particular volume of gap 290 to reach a predetermined height 422 of underfill layer 420 within gap 290 between semiconductor dies 110 and 120. In an embodiment, the amount of underfill material 410 dispensed can be controlled based on the dot size of underfill material 410 dispensed and the number of dots dispensed. It should be appreciated that by dispensing a controlled amount of underfill material 410 between gap 290 located between semiconductor dies 110 and 120 prior to attaching semiconductor structure 400 to a package substrate, such as package substrate 810 (depicted in FIG. 8), gaps 280 and 286 can be completely filled with underfill material 410 without any excess underfill material 410 contaminating any neighboring surfaces outside of gaps 280 and 286.

In an embodiment, and as depicted in FIG. 4, a top surface 424 of underfill layer 420 formed within gap 290 has a concave meniscus shape. This concave meniscus shape is formed due to the surface tension of underfill material 410 along the sides of semiconductor dies 110 and 120 that form gap 290. In an embodiment, and as depicted in FIG. 1, height 422 of underfill layer 420 within gap 290 is precalculated based on a maximum amount of underfill material 410 that can be dispensed within gap 290 without any excess underfill material 410 forming outside of the outermost ends of gaps 280 and 286.

Figure 5:
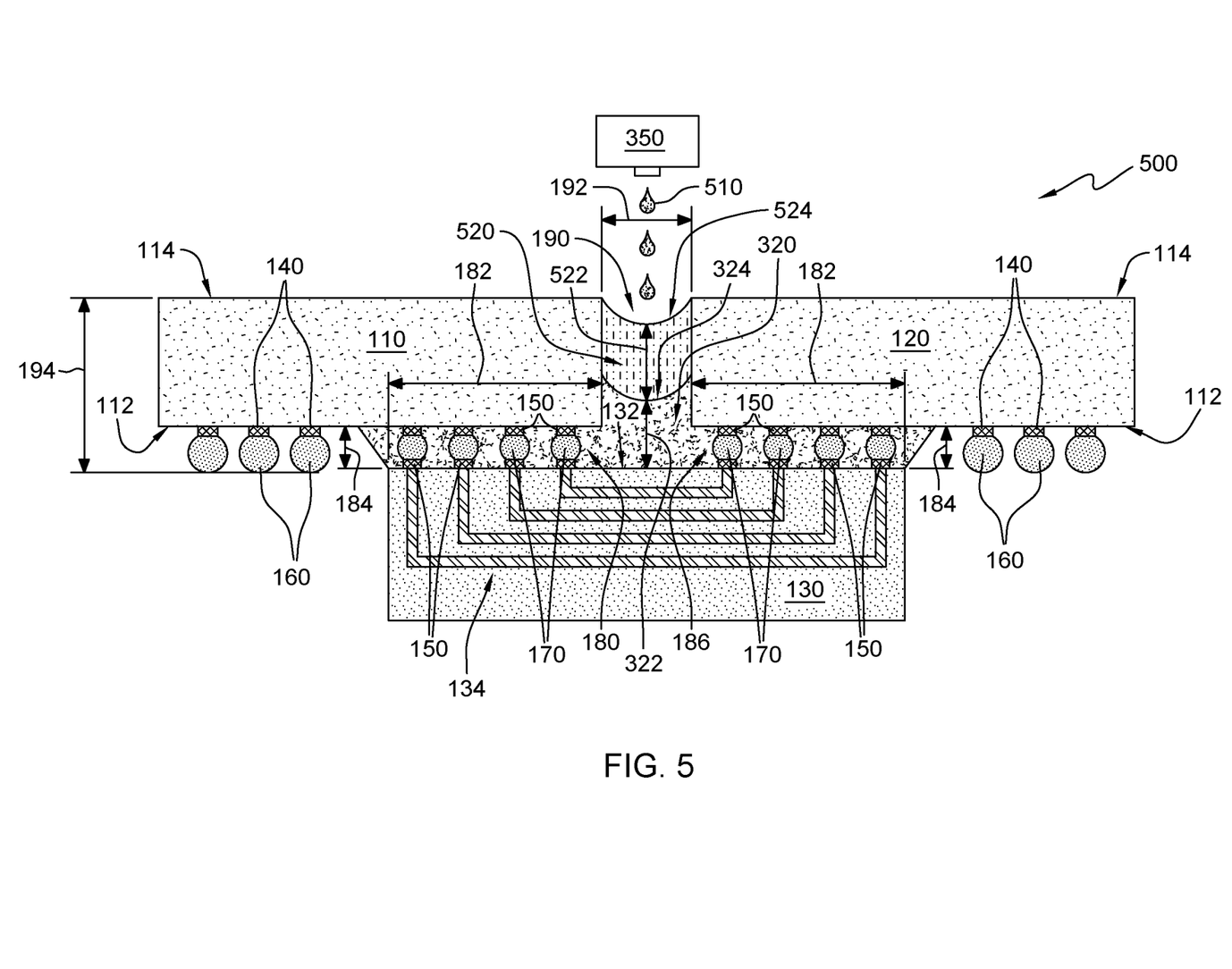
FIG. 5 is a cross-sectional view of interconnected semicondcutor subassembly structure 300 after formation of a chip binding layer 520, generally depicted as interconnected semicondcutor subassembly structure 500, in accordance with at least one embodiment of the present invention.

Referring now to FIG. 5, FIG. 5 is a cross-sectional view of interconnected semicondcutor subassembly structure 300 after formation of a chip binding layer 520, generally depicted as interconnected semicondcutor subassembly structure 500, in accordance with at least one embodiment of the present invention. As depicted in FIG. 5, chip binding material 510 has been deposited by dispenser 350 within gap 190 and cured to form chip binding layer 520. Specifically, chip binding layer 520 is formed on top surface 324 of underfill layer 320 and partially fills gap 190 between semiconductor dies 110 and 120. In an embodiment, chip binding material 510 deposited within gap 190 self-cures as additional chip binding material 510 is deposited, thus reducing the number of processing steps. In another embodiment, chip binding material 510 only partially cures during the deposition of chip binding material 510 and an additional post-cure processing step is performed. Chip binding material 510 can be any chip binding materials known in the art. In an embodiment, chip binding material 510 is the same material composition as underfill material 310. In another embodiment, chip binding material 510 has a different material composition than underfill material 310.

The amount of chip binding material 510 that is required to be deposited within gap 190 is based, at least in part, on a remaining volume of gap 190 after forming underfill layer 320, plus a particular volume of gap 190 to reach a predetermined height of chip binding layer 520 within gap 190. For example, the height 522 of chip binding layer 520 within gap 190 is precalculated based on a maximum amount of chip binding material 510 that can be dispensed within gap 190 without any excess chip binding material 510 forming on the top surface 114 of semiconductor dies 110 and 120, respectively. This stems from the fact that any chip binding material 510 deposited outside of gap 190 will likely result in contamination of the top surface 114 of semiconductor dies 110 and 120. In an embodiment, and as depicted in FIG. 5, a top surface 524 of chip binding layer 520 formed within gap 190 has a concave meniscus shape. This concave meniscus shape is formed due to the surface tension of chip binding material 510 along the sides of semiconductor dies 110 and 120 that form gap 190.

In an embodiment, the amount of chip binding material 510 dispensed can be controlled based on the dot size of chip binding material 510 dispensed and the number of dots dispensed. It should be appreciated that by forming an additional chip binding layer in chip binding layer 520 on top of underfill layer 320, any future microbump 170 joint stress created during subsequent solder reflow and curing when attaching semiconductor subassembly structure 500 to a package substrate, such as package substrate 710 (depicted in FIG. 7) is further mitigated. This stems from the fact that embodiments of the present invention have demonstrated that as the height of the underfill material and/or chip binding material formed within gap 190 between semiconductor dies 110 and 120 increases, the amount of movement of semiconductor dies 110 and 120 due to temperature fluctuations decreases. Accordingly, as the amount of movement of semiconductor dies 110 and 120 decreases due to temperature fluctuations, so too does any mechanical joint stress on microbumps 170 formed between semiconductor dies 110, 120 and interconnect structure 130.

Figure 6:
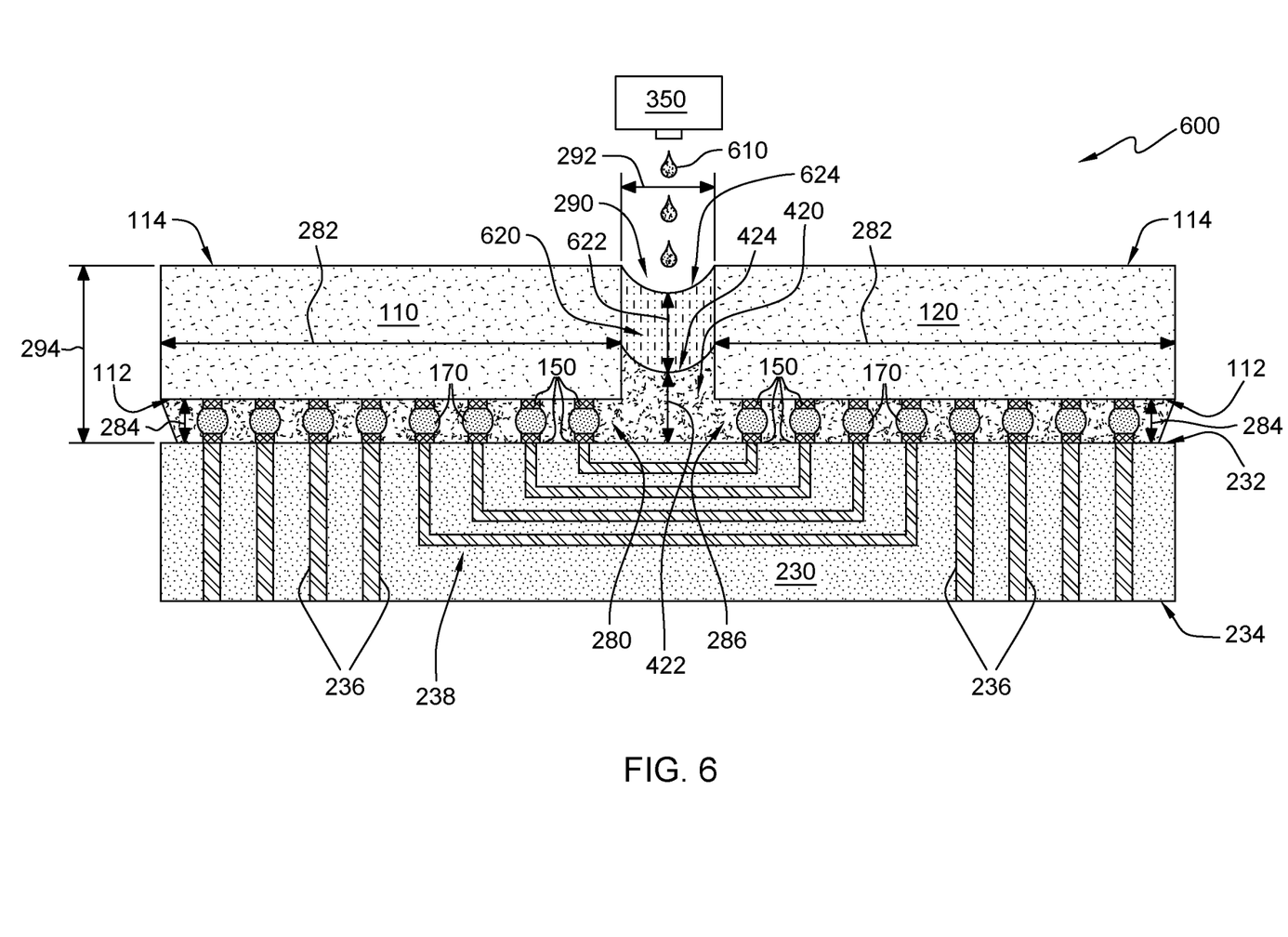
FIG. 6 is a cross-sectional view of interconnected semicondcutor subassembly structure 400 after formation of a chip binding layer 620, generally depicted as interconnected semicondcutor subassembly structure 600, in accordance with at least one embodiment of the present invention.

Referring now to FIG. 6, FIG. 6 is a cross-sectional view of interconnected semicondcutor subassembly structure 400 after formation of a chip binding layer 620, generally depicted as interconnected semicondcutor subassembly structure 600, in accordance with at least one embodiment of the present invention. As depicted in FIG. 6, chip binding material 610 has been deposited by dispenser 350 within gap 290 and cured to form chip binding layer 620. Specifically, chip binding layer 620 is formed on top surface 424 of underfill layer 420 and partially fills gap 290 between semiconductor dies 110 and 120. In an embodiment, chip binding material 610 deposited within gap 290 self-cures as additional chip binding material 610 is deposited, thus reducing the number of processing steps. In another embodiment, chip binding material 610 only partially cures during the deposition of chip binding material 610 and an additional post-cure processing step is performed. Chip binding material 610 can be any chip binding materials known in the art. In an embodiment, chip binding material 610 is the same material composition as underfill material 410. In another embodiment, chip binding material 610 has a different material composition than underfill material 410.

The amount of chip binding material 610 that is required to be deposited within gap 290 is based, at least in part, on a remaining volume of gap 290 after forming underfill layer 420, plus a particular volume of gap 290 to reach a predetermined height of chip binding layer 620 within gap 290. For example, the height 622 of chip binding layer 620 within gap 290 is precalculated based on a maximum amount of chip binding material 610 that can be dispensed within gap 290 without any excess chip binding material 610 forming on the top surface 114 of semiconductor dies 110 and 120, respectively. This stems from the fact that any chip binding material 610 deposited outside of gap 290 will likely result in contamination of the top surface 114 of semiconductor dies 110 and 120. In an embodiment, and as depicted in FIG. 6, a top surface 624 of chip binding layer 620 formed within gap 290 has a concave meniscus shape. This concave meniscus shape is formed due to the surface tension of chip binding material 610 along the sides of semiconductor dies 110 and 120 that form gap 290.

In an embodiment, the amount of chip binding material 610 dispensed can be controlled based on the dot size of chip binding material 610 dispensed and the number of dots dispensed. It should be appreciated that by forming an additional chip binding layer in chip binding layer 620 on top of underfill layer 420, any future microbump 170 joint stress created during subsequent solder reflow and curing when attaching semiconductor subassembly structure 600 to a package substrate, such as package substrate 810 (depicted in FIG. 8) is further mitigated. This stems from the fact that embodiments of the present invention have demonstrated that as the height of the underfill material formed within gap 290 between semiconductor dies 110 and 120 increases, the amount of movement of semiconductor dies 110 and 120 due to temperature fluctuations decreases. Accordingly, as the amount of movement of semiconductor dies 110 and 120 decreases due to temperature fluctuations, so too does any mechanical joint stress on microbumps 170 formed between semiconductor dies 110, 120 and interconnect structure 230.

Figure 7:
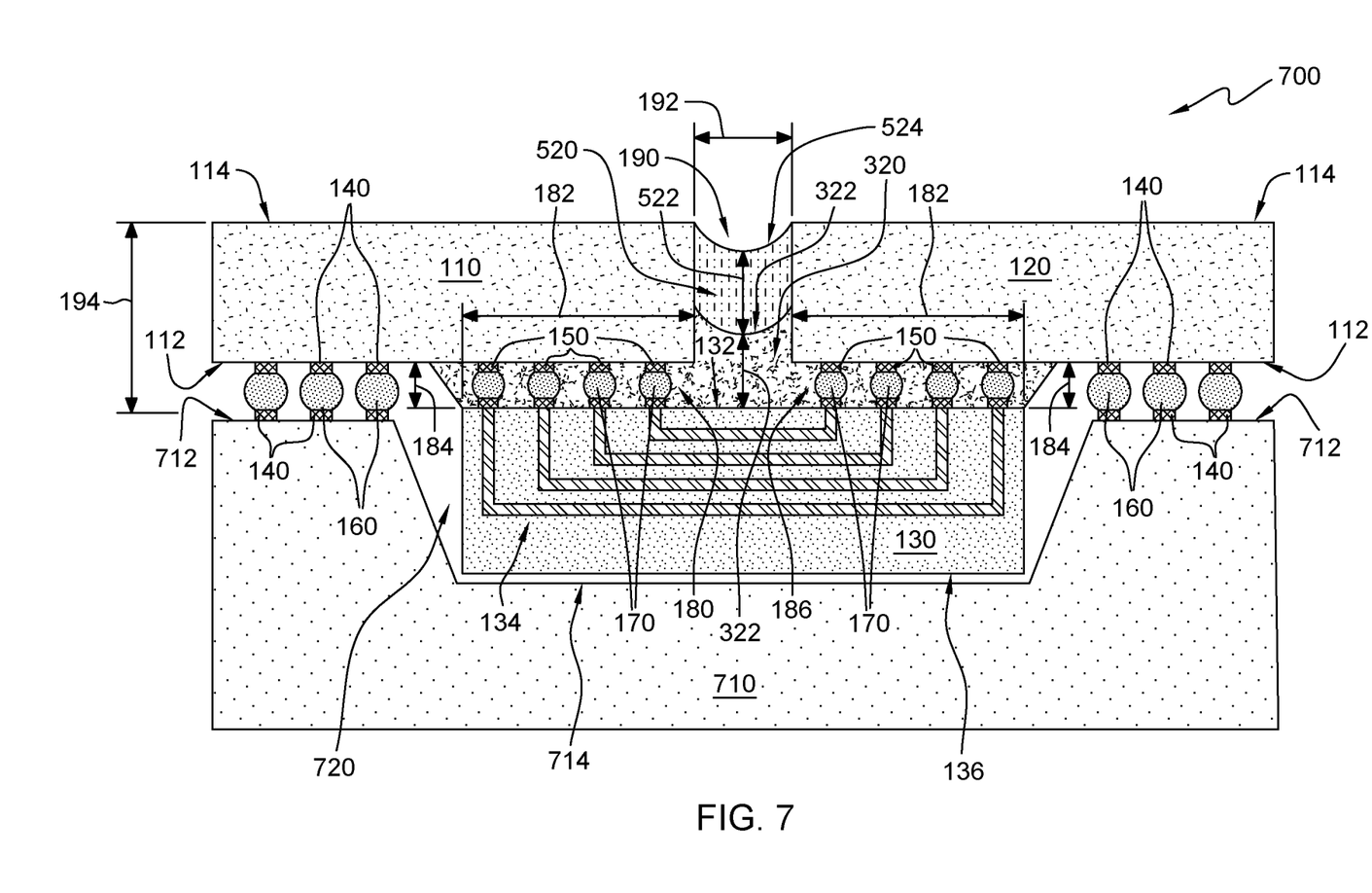
FIG. 7 is a cross-sectional view of interconnected semicondcutor subassembly structure 500 attached to a package substrate 710, generally depicted as interconnected semiconductor structure 700, in accordance with at least one embodiment of the present invention.

Referring now to FIG. 7. FIG. 7 is a cross-sectional view of interconnected semicondcutor subassembly structure 500 attached to a package substrate 710, generally depicted as interconnected semiconductor structure 700, in accordance with at least one embodiment of the present invention. Package substrate 710 can be made from any generally known substrates. For example, package substrate 710 can be an organic laminate substrate formed from organic materials such as organic resin and epoxy resin. In another example, package substrate 710 can be an inorganic substrate formed from inorganic materials such as glass or ceramic. In yet another example, package substate 710 can be a composite material formed from a combination of organic and inorganic materials.

Prior to forming semiconductor structure 700 as depicted in FIG. 7, a portion of package substrate 710 was removed to form an opening 720 in package substrate 710 and bonding pads 140 were formed on portions of top surface 712 of package substrate 710. As depicted in FIG. 7, the height of the opening formed in package substate 710 is greater than the height of interconnect structure 130 such that interconnect structure 130 is completely embedded within package substrate 710 while still leaving a small gap between bottom surface 136 of interconnect structure 130 and surface 714 of package substate 710. However, in an alternate embodiment, the height of opening 720 formed in package substrate 710 may be equal to the height of interconnect structure 130 such that interconnect structure 130 is completely embedded within package substrate 710 with no gap between bottom surface 136 of interconnect structure 130 and surface 714 of package substate 710. In yet another alternative embodiment, the height of the opening formed in package substrate 710 is less than the height of interconnect structure 130 such that interconnect structure 130 is partially embedded within opening 720 of package substrate 710 such that an upper portion of interconnect structure 130 is above top surface 712 of package substrate 710.

After bonding pads 140 were formed on portions of top surface 712 of package substrate 710, solder bumps 160 located on bottom surface 112 of semiconductor dies 110 and 120 were lined up with and attached to corresponding bonding pads 140 located on top side 712 of package substrate 710 as depicted in FIG. 7. The attachment of subassembly structure 600 to package substrate 710 can be completed by heating semiconductor structure 700, which results in the reflow of solder bumps 160, followed by a subsequent cooling period. After the cooling of semiconductor structure 700, a solder bond or solder joint is formed between solder bumps 160 and bonding pads 140 located on bottom surface 136 of interconnect structure 130 and top surface 712 of package substate 710. In an embodiment, formic acid reflow of solder bumps 160 can be performed if flux is not used in the soldering process.

It should be appreciated that by forming underfill layer 320 and chip binding layer 520 within gap 190 prior to bonding interconnected semiconductor subassembly structure 500 to package substrate 710 to form interconnected semiconductor structure 700, interconnected semicondcutor structure 500 is able to be bonded to package substrate 710 without the need for any pre-cooling or atmospheric plasma bonding processes. It should be further be appreciated that as compared to interconnected semiconductor structure 700 formed without any underfill layer and/or chip binding layer between semicondcutor dies 110 and 120, interconnected semicondcutor structure 700 as depicted in FIG. 7 underwent significantly less chip movement during temperature cycling. For example, during temperature cycling from 100° C. to −50° C., interconnected semiconductor structure 700 without any underfill layer formed between semicondcutor dies 110 and 120 had a change in thermal shrinkage of 3.9 um, while interconnected semiconductor structure 700 as depicted in FIG. 7 had a change in thermal shrinkage of only 0.7 um.

Figure 8:
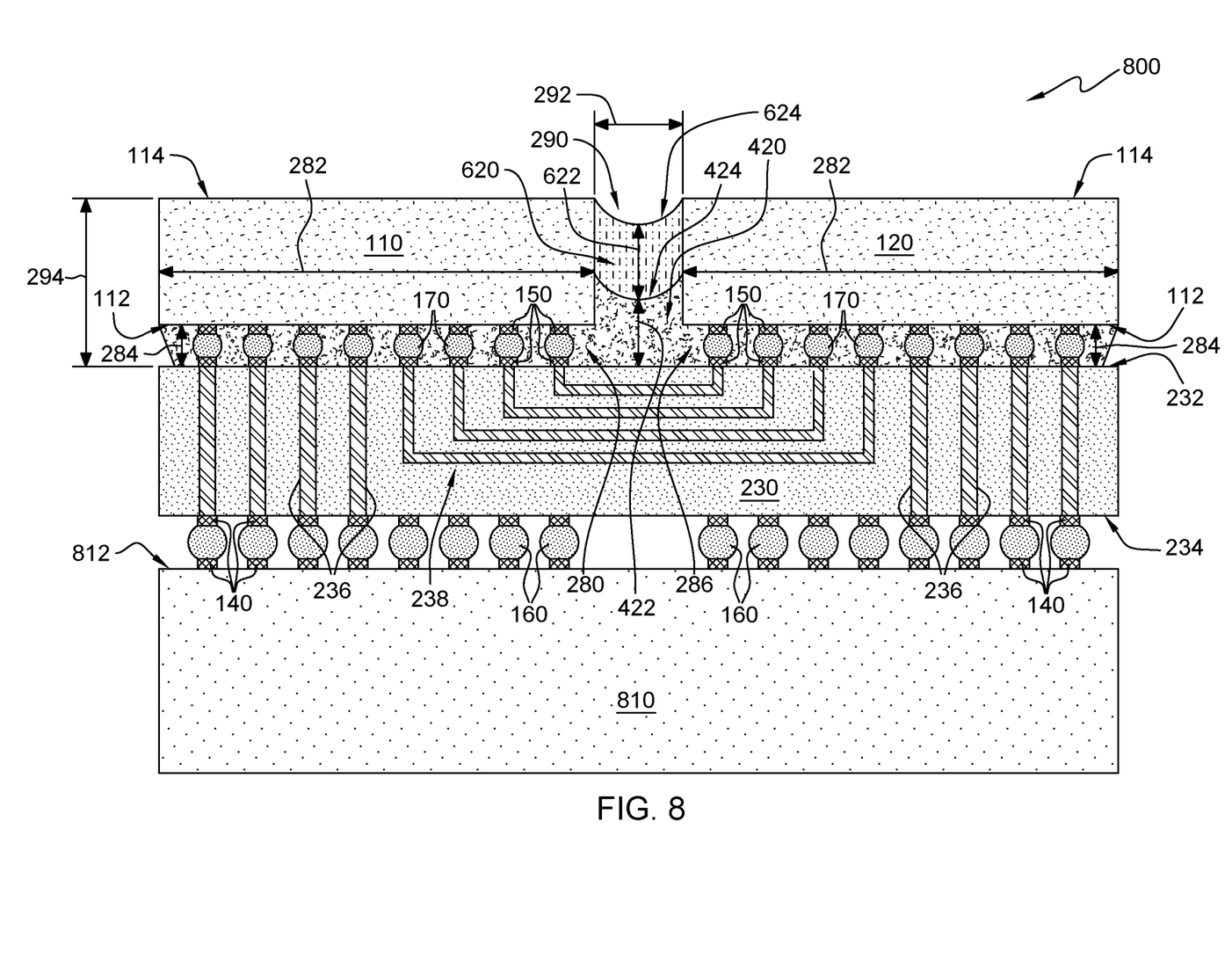
FIG. 8 is a cross-sectional view of interconnected semicondcutor subassembly structure 600 attached to a package substrate 810, generally depicted as interconnected semiconductor structure 800, in accordance with at least one embodiment of the present invention.

Referring now to FIG. 8, FIG. 8 is a cross-sectional view of interconnected semicondcutor subassembly structure 600 attached to a package substrate 810, generally depicted as interconnected semiconductor structure 800, in accordance with at least one embodiment of the present invention. Package substrate 810 can be made from any generally known substrates. For example, package substrate 810 can be an organic laminate substrate formed from organic materials such as organic resin and epoxy resin. In another example, package substrate 810 can be an inorganic substrate formed from inorganic materials such as glass or ceramic. In yet another example, package substate 810 can be a composite material formed from a combination of organic and inorganic materials.

Prior to forming semiconductor structure 800 as depicted in FIG. 8, bonding pads 140 were initially formed on portions of what is now depicted as bottom side 234 of interconnect structure 230 and top side of 812 of package substrate 810. Solder bumps 160 were thereafter formed on top of bonding pads 140 located on bottom surface 234 of interconnect structure 230. After solder bumps 160 were formed on top of bonding pads 140 located on bottom surface 234 of interconnect structure 230, subassembly structure 600 was flipped over or turned upside down, and solder bumps 160 were lined up with and attached to corresponding bonding pads 140 located on top side 812 of package substrate 810 as depicted in FIG. 8. The attachment of subassembly structure 600 to package substrate 810 can be completed by heating semiconductor structure 800, which results in the reflow of solder bumps 160, followed by a subsequent cooling period. After the cooling of semiconductor structure 800, a solder bond or solder joint is formed between solder bumps 160 and bonding pads 140 located on bottom surface 234 of interconnect structure 230 and top surface of package substate 812. In an embodiment, formic acid reflow of solder bumps 160 can be performed if flux is not used in the soldering process.

According to one embodiment of the present invention, a method of forming an interconnected semicondcutor subassembly structure is disclosed. The method includes: bonding a first semicondcutor die to a first portion of an interconnect structure, bonding a second semicondcutor die to a second portion of the interconnect structure, and forming an underfill layer within a first gap located between the first semiconductor die and the first portion of the interconnect structure, within a second gap located between the second semiconductor die and the second portion of the interconnect structure, and within a first portion of a third gap located between the first semicondcutor die and the second semicondcutor die. A top surface of the underfill layer formed within the first portion of the third gap located between the first semicondcutor die and the second semicondcutor die has a concave meniscus shape.

The method according to paragraph [0076], wherein forming the underfill layer includes depositing an underfill material between the third gap located between the first semiconductor die and the second semicondcutor die, and wherein the underfill material flows into the first and second gaps by capillary action.

The method according to paragraph [0076], wherein the underfill material is deposited between the third gap located between the first semiconductor die and the second semiconductor die by a jet dispenser.

The method according to paragraph [0076], wherein a gap length of the third gap located between the first and second semicondcutor dies is greater than a gap height of the first and second gaps located between the first and second semicondcutor dies and the interconnect structure, respectively.

The method according to paragraph [0076], wherein the interconnect structure is at least one of an interposer or a bridge.

The method according to paragraph [0076], further comprising bonding the interconnected semicondcutor subassembly structure to a package substrate after the underfill layer has cured.

The method according to paragraph [0076], further comprising forming a chip binding layer on top of the underfill layer formed within the first portion of the third gap located between the first semicondcutor die and the second semicondcutor die, wherein a top surface of the chip binding layer has a concave meniscus shape.

The method according to paragraph [0082], wherein forming the chip binding layer comprises depositing a chip binding material between the third gap located between the first semiconductor die and the second semicondcutor die and on top of the underfill layer, and wherein the underfill layer and the chip binding layer have at least one of a similar material composition or a different material composition.

The method according to paragraph [0082], further comprising bonding the interconnected semicondcutor subassembly structure to a package substrate after both the underfill layer and the chip binding layer have cured.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. An interconnected semiconductor subassembly structure, comprising:
    an interconnect structure;
    a first semiconductor die bonded to a first portion of a top surface of the interconnect structure;
    a second semiconductor die bonded to a second portion of the top surface of the interconnect structure; and
    an underfill layer formed within a first gap located between a bottom surface of the first semiconductor die and the first portion of the top surface of the interconnect structure, formed within a second gap located between a bottom surface of the second semiconductor die and the second portion of the top surface of the interconnect structure, and formed within a first portion of a third gap located between the first semiconductor die and the second semiconductor die, wherein a top surface of the underfill layer formed within the first portion of the third gap located between the first semiconductor die and the second semiconductor die has a concave meniscus shape; and
    a chip binding layer formed on top of the underfill layer formed within the first portion of the third gap located between the first semiconductor die and the second semiconductor die, wherein a top surface of the chip binding layer has a concave meniscus shape.

2. The interconnected semiconductor subassembly structure of claim 1, wherein the underfill layer and the chip binding layer have a similar material composition.

3. The interconnected semiconductor subassembly structure of claim 1, wherein the underfill layer and the chip binding layer have a different material composition.

4. The interconnected semiconductor subassembly structure of claim 1, wherein the top surface of the chip binding layer is located below a top surface of the first semiconductor die and a top surface of the second semiconductor die.

5. The interconnected semiconductor subassembly structure of claim 1, wherein a gap length of the third gap located between the first and second semiconductor dies is greater than a gap height of the first gap located between the first semiconductor die and the interconnect structure and greater than a gap height of the second gap located between the second semiconductor die and the interconnect structure.

6. The interconnected semiconductor subassembly structure of claim 1, wherein a gap width of the third gap is greater than a gap height of the first and second gaps combined.

7. The interconnected semiconductor subassembly structure of claim 1, wherein a gap length of the first and second gaps located between the first and second semiconductor dies and the interconnect structure, respectively, is greater than or equal to 50 um and less than or equal to 500 um.

8. The interconnected semiconductor subassembly structure of claim 1, wherein a gap height of the first and second gaps located between the first and second semiconductor dies and the interconnect structure, respectively, is greater than or equal to 5 um and less than or equal to 100 um.

9. The interconnected semiconductor subassembly structure of claim 1, wherein the interconnect structure is at least one of an interposer or a bridge.

10. The interconnected semiconductor subassembly structure of claim 1, wherein the first and second semiconductor dies are bonded to the interconnect structure by a plurality of micro metal joints.

11. A method of forming an interconnected semiconductor subassembly structure, comprising:
- bonding a first semiconductor die to a first portion of an interconnect structure;
- bonding a second semiconductor die to a second portion of the interconnect structure; and
- forming a underfill layer within a first gap located between the first semiconductor die and the first portion of the interconnect structure, within a second gap located between the second semiconductor die and the second portion of the interconnect structure, and within a first portion of a third gap located between the first semiconductor die and the second semiconductor die, wherein a top surface of the underfill layer formed within the first portion of the third gap located between the first semiconductor die and the second semiconductor die has a concave meniscus shape; and
- forming a chip binding layer on top of the underfill layer formed within the first portion of the third gap located between the first semiconductor die and the second semiconductor die, wherein a top surface of the chip binding layer has a concave meniscus shape.

12. The method of claim 11, wherein forming the underfill layer comprises:
- depositing the underfill material between the third gap located between the first semiconductor die and the second semiconductor die, wherein the underfill material flows into the first and second gaps by capillary action.

13. The method of claim 11, wherein the underfill material is deposited between the third gap located between the first semiconductor die and the second semiconductor die by a jet dispenser.

14. The method of claim 11, wherein a gap length of the third gap located between the first and second semiconductor dies is greater than a gap height of the first and second gaps located between the first and second semiconductor dies and the interconnect structure, respectively.

15. The method of claim 11, wherein the interconnect structure is at least one of an interposer or a bridge.

16. The method of claim 11, further comprising:
- bonding the interconnected semiconductor subassembly structure to a package substrate after the underfill layer has cured.

17. The method of claim 11, wherein forming the underfill layer comprises:
- depositing a chip binding material between the third gap located between the first semiconductor die and the second semiconductor die and on top of the underfill layer, wherein the underfill layer and the chip binding layer have at least one of a similar material composition or a different material composition.

18. The method of claim 11, further comprising:
- bonding the interconnected semiconductor subassembly structure to a package substrate after both the underfill layer and the chip binding layer have cured.

19. A method of forming an interconnected semiconductor subassembly structure, comprising:
- bonding a first semiconductor die to a first portion of an interconnect structure;
- bonding a second semiconductor die to a second portion of the interconnect structure; and
- forming a underfill layer within a first gap located between the first semiconductor die and the first portion of the interconnect structure, within a second gap located between the second semiconductor die and the second portion of the interconnect structure, and within a first portion of a third gap located between the first semiconductor die and the second semiconductor die, wherein a top surface of the underfill layer formed within the first portion of the third gap located between the first semiconductor die and the second semiconductor die has a concave meniscus shape; and
- controlling an amount of the underfill material dispensed based on a dot size of the underfill material dispensed and a total number of dots of the underfill material dispensed.

20. The method of claim 19, further comprising precalculating a height of the underfill layer based on a maximum amount of the underfill material that can be dispensed within the third gap without any excess underfill material forming outside of outermost ends of the first gap and the second gap.

* * * * *